United States Patent
Bacher et al.

(10) Patent No.: US 11,867,781 B2
(45) Date of Patent: Jan. 9, 2024

(54) METHOD FOR EVALUATING A PILOT TONE SIGNAL IN A MAGNETIC RESONANCE FACILITY, MAGNETIC RESONANCE FACILITY, COMPUTER PROGRAM AND ELECTRONICALLY READABLE DATA MEDIUM

(71) Applicant: Siemens Healthcare GmbH, Erlangen (DE)

(72) Inventors: Mario Bacher, Erlangen (DE); Matthias Fenchel, Erlangen (DE); Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 334 days.

(21) Appl. No.: 17/152,911

(22) Filed: Jan. 20, 2021

(65) Prior Publication Data
US 2021/0239778 A1    Aug. 5, 2021

(30) Foreign Application Priority Data

Jan. 30, 2020  (DE) .......................... 102020201102

(51) Int. Cl.
  *G01R 33/36* (2006.01)
  *G01R 33/567* (2006.01)
  (Continued)

(52) U.S. Cl.
  CPC ......... *G01R 33/36* (2013.01); *G01R 33/4818* (2013.01); *G01R 33/5602* (2013.01);
  (Continued)

(58) Field of Classification Search
  CPC ............ G01R 33/4818; G01R 33/5602; G01R 33/5608; G01R 33/567; G06F 18/2133
  See application file for complete search history.

(56) References Cited

U.S. PATENT DOCUMENTS

| | | | |
|---|---|---|---|
| 2017/0160364 A1 | 6/2017 | Fenchel | |
| 2017/0160367 A1 | 6/2017 | Schröter | |
| 2018/0353139 A1 | 12/2018 | Speier | |

FOREIGN PATENT DOCUMENTS

| | | |
|---|---|---|
| DE | 102015224158 A1 | 6/2017 |
| DE | 102015224162 A1 | 6/2017 |
| EP | 3413075 A1 | 12/2018 |

OTHER PUBLICATIONS

Cao, Bin, et al. "Detect and Track Latent Factors with Online Nonnegative Matrix Factorization." IJCAI. vol. 7. 2007. pp. 2689-2694.

(Continued)

*Primary Examiner* — Dixomara Vargas
(74) *Attorney, Agent, or Firm* — Lempia Summerfield Katz LLC

(57) ABSTRACT

A computer-implemented method is provided for evaluating a pilot tone signal. In the method, the pilot tone signal is recorded using a high-frequency coil arrangement of a magnetic resonance facility and describes a movement of a patient. The method also includes extracting movement information assigned to a movement component, (e.g., a respiratory movement). A breakdown or decomposition of the pilot tone signal is effected on a basis of signal components having assigned weightings and for the purpose of determining the movement information, a part of a base which is assigned to the movement component is selected by a selection criterion. For the purpose of determining the base and the weightings, a non-negative matrix factorization is performed, in the context of which a signal matrix, which is formed from the pilot tone signal and is in particular non-negative, is formulated as a product of a non-negative signal component matrix that describes the base and a non-negative weighting matrix that describes the weightings.

20 Claims, 4 Drawing Sheets

(51) Int. Cl.
*G01R 33/48* (2006.01)
*G01R 33/56* (2006.01)
*G06F 18/2133* (2023.01)

(52) U.S. Cl.
CPC ....... *G01R 33/567* (2013.01); *G01R 33/5608* (2013.01); *G06F 18/2133* (2023.01)

(56) References Cited

OTHER PUBLICATIONS

German Office Action for German Application No. 10 2020 201102.8 dated Nov. 27, 2020.
Smaragdis, Paris, and Judith C. Brown. "Non-negative matrix factorization for polyphonic music transcription." 2003 IEEE Workshop on Applications of Signal Processing to Audio and Acoustics (IEEE Cat. No. 03TH8684). IEEE, 2003. pp. 177-180.
Wikipedia.org, Non-negative matrix factorization, URL: https://en.wikipedia.org/wiki/Non-negative_matrix_factorization, Stand: Oct. 12, 2019. pp. 1-11.
Woo, Jonghye, et al. "A sparse non-negative matrix factorization framework for identifying functional units of tongue behavior from MRI." IEEE transactions on medical imaging 38.3 (2018): 730-740.
Zhao, Renbo et al:; "Online Nonnegative Matrix Factorization With Outliers"; IEEE; ISSN: 1803-7232; 2016. pp. 2662-2666.

2 Magnetic resonance facility
3 Main magnet unit
4 Patient holder
5 Patient couch
6 High-frequecy coil arrangement
7 High-frequency coils
8 Transmit unit
9 Control facility 10 Interface
11 Learning unit
12 Extraction unit
13, 14 Monitoring units
15 Storage
16 Sequence unit
17 Evaluation unit

METHOD FOR EVALUATING A PILOT TONE SIGNAL IN A MAGNETIC RESONANCE FACILITY, MAGNETIC RESONANCE FACILITY, COMPUTER PROGRAM AND ELECTRONICALLY READABLE DATA MEDIUM

The present patent document claims the benefit of German Patent Application No. 10 2020 201 102.8, filed Jan. 30, 2020, which is hereby incorporated by reference in its entirety.

TECHNICAL FIELD

The disclosure relates to a computer-implemented method for evaluating a pilot tone signal, which is recorded using a high-frequency coil arrangement of a magnetic resonance facility and describes a movement of a patient, and for extracting movement information assigned to a movement component, in particular a respiratory movement, wherein a breakdown or decomposition of the pilot tone signal is effected on a basis of signal components having assigned weightings and, for the purpose of determining the movement information, a part of a base assigned to the movement component is selected by a selection criterion. The disclosure further relates to a magnetic resonance facility, a computer program, and an electronically readable data medium.

BACKGROUND

Magnetic resonance imaging is now an established medical modality, particularly in the field of diagnostics. Magnetic resonance examinations, which are executed, (e.g., according to a magnetic resonance sequence), may require an extended examination time in this case, during which movements of the patient being examined may occur, either due to periodic movement components such as respiration and heartbeat or due to other unintentional or intentional movements of the patient. A multiplicity of methods for movement monitoring and/or movement correction for magnetic resonance facilities are therefore already proposed in the prior art.

DE 10 2015 224 162 A1 proposes a method for determining movement information, this describing a movement in an examination region that moves at least partially, by a pilot tone signal. It is proposed therein to output at least one excitation signal in a first frequency band and to record received signals (e.g., a pilot tone signal), as generated by the excitation signal, by the high-frequency coil arrangement of the magnetic resonance facility using a plurality of receive channels. Specifically, for the purpose of determining the movement information, it is proposed to combine the complex received signals of all receive channels, e.g., the pilot tone signal, at a time point according to a combination rule, this being determined over a time period by an analysis of the received signals which identifies at least one movement portion that contributes to the movement concerned. This is based on the concept of emphasizing specific partial movements of the total movement, in particular respiration and/or heartbeat, or extracting the partial movements from the total movement, by combining the received signals of different receive channels in a suitable manner. With regard to such pilot tone signals in this case, it is taken into consideration that both phase and amplitude are modulated by movements of the patient, and therefore complex received signals may be observed.

Such a so-called pilot tone navigator has proven to be a method which is particularly sensitive to movement. Nevertheless, the extraction and the separation of different movement components from the large volume of multichannel data remains a challenge and may be regarded as a variant of unsupervised learning.

As described in the cited DE 10 2015 224 162 A1, a suitable combination of the received signals from various receive channels, which combination describes a specific relevant movement component of the total movement, e.g., the respiratory movement, may be found by a calibration scan. This may however have the disadvantage that additional movement components, which did not occur during the calibration, may interfere with the extracted movement component if they do then occur. It is further proposed to make use of unsupervised learning methods such as, e.g., Principal Component Analysis (PCA) or Independent Component Analysis (ICA). This procedure requires the whole of the data, e.g., the complete pilot tone signal, to be present before the movement extraction may take place, which may be difficult in practice. Moreover, these methods in which a base (main components or independent components) and weightings are found, may result in the base also containing signal components that are difficult to interpret and cannot be cleanly separated. In particular, it may be unclear how the movement component may be separated in an automatic manner from the remaining movements. A further problem associated with PCA and ICA is that negative factors may arise, as a result of which partial signals that occur may be unintentionally wiped out. This may lead to errors or less than optimal results in the movement extraction.

SUMMARY AND DESCRIPTION

The object of the disclosure is therefore to specify a robust and efficient method offering real-time capability and low error susceptibility, for deriving movement information relating to a movement component, in particular the respiratory movement.

The scope of the present disclosure is defined solely by the appended claims and is not affected to any degree by the statements within this summary. The present embodiments may obviate one or more of the drawbacks or limitations in the related art.

In a method of the type cited in the introduction, provision is made for performing a non-negative matrix factorization in order to determine the base and the weightings, wherein a signal matrix, which is formed from the pilot tone signal and is in particular non-negative, is formulated as a product of a non-negative signal component matrix that describes the base and a non-negative weighting matrix that describes the weightings.

In this case, a vector may refer to a matrix (which is one-dimensional in a direction). In particular, the signal matrix and the weighting matrix may be specified as vectors. The pilot tone signal may be recorded via a plurality of receive channels, in particular a plurality of high-frequency coils and/or combinations of high-frequency coils of the high-frequency coil arrangement, wherein the totality of the received signals from the individual receive channels may be understood to be a pilot tone signal. For the purpose of determining the movement information, the pilot tone signal is observed on the basis of time points, wherein the time points may be the sampling time points, but time windows including a plurality of sampling time points may also be defined in which, e.g., averaging takes place. The pilot tone signal is therefore present in discretized form.

The high-frequency coil arrangement may be the group of high-frequency coils also used for magnetic resonance imaging, e.g., for receiving magnetic resonance signals. The transmit unit, which emits the excitation signal that is received as a pilot tone signal or received signal by the high-frequency coil arrangement, may be provided in addition to the high-frequency coil arrangement but may also form a part thereof. It transmits in a frequency band which may be different than the magnetic resonance band that extends around the Larmor frequency of the magnetic resonance facility and is used for magnetic resonance imaging but may be close to this.

According to the disclosure, a pilot tone navigator is therefore implemented, wherein the pilot tone signal recorded in particular by a plurality of receive channels is evaluated in order that a specific movement component, which may also be referred to as a partial movement, may be extracted. In this case, the movement information may advantageously include the whole signal component matrix as well as extraction information describing those signal components of the base which are to be used for extracting the movement component, whereby, e.g., application to subsequently recorded pilot tone signals is possible as illustrated in greater detail below.

Use may therefore be made of a transmit unit, (e.g., including at least one transmit coil), which outputs at least one excitation signal in a first frequency band, wherein received signals which are generated by the excitation signal and in their totality form the pilot tone signal are recorded by a high-frequency coil arrangement of the magnetic resonance facility using a plurality of receive channels, wherein the high-frequency coils of the high-frequency coil arrangement are designed to record a receive frequency band which includes the first frequency band. For the purpose of determining the movement information, the complex received signals of the receive channels are combined to form the pilot tone signal.

For the purpose of evaluating the pilot tone signal, a variant of unsupervised learning is now deployed which includes non-negative matrix factorization (NMF). The concept of NMF is in principle to represent a signal, the signal matrix V derived from the pilot tone signal in this case, as a product of two non-negative matrices, $V=W \times H$, where W contains the base vectors (e.g., the individual signal components) as columns, and H contains their corresponding weightings.

The great advantage of NMF is the requirement for non-negativity of the matrices W, H, because this forces a composition or superimposition of a plurality of natural sources or building blocks of signals. This is particularly advantageous, because the natural physiological movement information is likewise based on real-value positive amplitude components. The non-negativity requirement is contrary to PCA and ICA, where partially negative factors may mutually wipe out signals that are actually present. In this case, algorithms which enable unsupervised learning by NMF are in principle already disclosed in the prior art and may also be deployed in the context of the present disclosure. In particular, provision may be made for the signal component matrix and the weighting matrix to be determined in an optimization process using a target function that includes a term which minimizes at least a norm of the difference between the signal matrix and the product of signal component matrix and weighting matrix. Basic concepts of NMF which may similarly be applied to the present application case are described, for example, in an article by Paris Smaragdis and Judith C. Brown, "Non-Negative Matrix Factorization for Polyphonic Music Transcription", 2003 IEEE Workshop on Applications of Signal Processing to Audio and Acoustics, 2003, pages 177-180. This work proposes the use of NMF for the automatic extraction of notes from polyphonic music, wherein the procedures described there may also be applied at least in part to the present disclosure.

A further particular advantage of NMF is that additional boundary conditions may be stipulated via the target function. In a particularly advantageous development, a further term of the target function adds a sparsely populated weighting matrix and/or a sparsely populated signal component matrix as an optimization target. This means that, for example, a sparsity of W and/or H may be imposed as an additional constraint or boundary condition during the calculation, such that compact representations and the suppression of noises or unintentional signal components are encouraged.

In summary, the disclosure therefore proposes the application of in particular unsupervised or optionally semi-supervised learning, for the extraction of movement components and in particular also for the separation of movement components on the basis of NMF, to pilot tone signals of a pilot tone navigator in the magnetic resonance, wherein in particular the NMF may be applied with sparsity boundary conditions in order to obtain a representation of the movement components which is as compact and noise-free as possible. It is therefore possible to extract advantageously separate movement components while additionally using the advantages of NMF, which in addition to the enforcement of the superimposition of natural fundamental part-signals also include the possibility of demanding sparsity.

As mentioned above, suitable optimization processes for finding the correct solution for the signal component matrix and the weighting matrix are known in principle from the prior art and may also be correspondingly deployed. In order to facilitate a faster convergence, provision may also be made for determining the initial values for the optimization process from a preliminary measurement, in particular, also on another patient.

In a particularly advantageous embodiment, a magnitude power spectrum of a defined time segment in the frequency space is determined as the signal matrix, for which purpose the pilot tone signal is Fourier-transformed and multiplied by its complex conjugate for each matrix entry. In other words, the pilot tone signal is converged in a preparatory act into a time series of magnitude power spectra, meaning that the pilot tone signal from a time window or defined time segment is converted by a discrete Fourier transformation and then multiplied by the complex conjugate for each individual value that occurs, in order to obtain a power spectrum. In this way, the pilot tone signal is converted into the various spectral frequency components of the different receive channels. The magnitude power spectrum is understood to be the signal matrix V, and therefore the learning act is applied to this signal matrix V by factorizing it as described above with $V=W \times H$, where V contains the input data in each time window as a long column vector. This means that the signal matrix V is formulated as a row vector containing all channels. Because the complex phase information of the original signal is eliminated as a result of the calculation of the magnitude power spectrum, the complex phase may advantageously be stored in a further vector (e.g., phase vector) and, if required for subsequent use (e.g., in the calculation of a metric/norm relating to the original signal), multiplied up again according to the component.

The signal components in W are then further analyzed and clustered in order to find those which contain the relevant movement component, e.g., the respiratory movement. In this case, for the purpose of determining movement information which describes a periodic movement component, provision may specifically be made for the selection criterion to include a bandpass filter which selects the frequency range of the periodic movement and/or the determination of a ratio of the signal energy within the frequency range to the signal energy outside the frequency range and/or a noise analysis and/or an entropy analysis. If at least largely periodic movement components are sought in the total movement in order to obtain movement information relating thereto, the frequency range in which the periodicity of the movement lies may be known, e.g., between 0.1 and 1 Hz in the case of respiratory movement. Bandpass filters may therefore be used, wherein it may also be conceivable to compare the signal energy in the frequency range of the periodic movement with the signal energy in other frequency ranges. This is particularly easy here because the frequency space is already being used for working.

It is also conceivable, e.g., in the context of semi-unsupervised learning, to make use of an additional default signal (e.g., an image-based navigator signal, e.g., from a one-dimensional projection image) which may be recorded by a further measuring apparatus and/or magnetic resonance facility and describe the movement component, and to select the combination which shows the maximum correlation with the default signal. In other words, if a further default signal which describes the movement component is present, the correlation with this may be considered as part of a selection criterion. If a further default signal which describes the movement component is present, the signal components assigned to the movement component may be found, specifically by maximizing the correlation with the default signal.

In a particularly advantageous development, provision may be made for the movement information describing the signal components that are assigned to the movement component to be specified for a calibration time period, in particular, having a length of 8 to 30 seconds in the case of the respiratory movement as a movement component, and applied to subsequently recorded pilot tone signals for the purpose of extracting the movement component, in particular for the purpose of determining a weighting matrix of the subsequently recorded pilot tone signal. As described above, the movement information in this case may include the whole signal component matrix, while additionally identifying those signal components which contribute to the movement component concerned. It is therefore conceivable when using a magnitude power spectrum, for example, to likewise convert the most recent subsequently recorded pilot tone signal into a magnitude power spectrum as described above. The weighting matrix H may then be determined as $H=W'\times V$, where W' is the pseudo inverse of the signal component matrix W. In other words, the weighting matrix may be determined by multiplying the signal matrix that is determined from the subsequently recorded pilot tone signal by the pseudo inverse of the signal component matrix. This in turn makes it possible to determine a reduced weighting matrix H° from the weighting matrix H for the subsequently recorded pilot tone signal, in which all weightings of all signal components are set to zero except those that were identified as contributing to the target movement component. This makes it possible in turn to determine an extracted power spectrum $W\times H°=V°$, wherein the actual movement signal of the movement component may be determined by inverse Fourier transformation of V°. At this point, the phase information previously stored in the phase vector may also be used again, if necessary. In a similar manner, the extraction of the movement component in this way may also be applied in the case of the pilot tone signal that is used to determine the movement information.

In this context, a further advantageous property of NMF may also be used herein, specifically the fact that a plurality of different methods and algorithms have already been proposed in relation to this analysis method, in order to update the movement information extremely quickly and effectively and therefore to learn a new relevant base and new relevant signal components. For it has been found that specifically in respect of periodic movements, (e.g., the respiratory movement), variable movement patterns in patients may occur which did not arise during the learning/calibration phase. In this context, a particularly advantageous development proposes that if a re-learning criterion is met which indicates that long-term suitability of the currently used base no longer applies, a new determination of the movement information is effected, in particular, taking the previous movement information as a starting point.

In this case, provision may be made specifically for the re-learning criterion to check whether a divergence value which describes the divergence of the product of the signal component matrix that is stored as part of the movement information and the determined weighting matrix of the subsequently recorded pilot tone signal from the signal matrix of the subsequently recorded pilot tone signal exceeds a first threshold value, and/or whether a second threshold value is exceeded for at least one weighting of the determined weighting matrix of the subsequently recorded pilot tone signal. In other words, application of the method makes it possible to continuously monitor whether the factorization W×H may continue to represent the pilot tone signal V. If this is not the case, and for example $\|V-W\times H\|>\varepsilon$, where $\varepsilon$ is a first threshold value, or if weighting factors in H exceed at least one defined second threshold value, renewed learning of the movement information may be triggered, wherein this may be done efficiently using known procedures without having to reprocess the complete dataset in the time domain. An exemplary procedure is described in an article by Bin Cao et al., "Detect and Track Latent Factors with Online Non-negative Matrix Factorization", IJCAI 2007, pages 2689-2694.

Accordingly, it is also possible to provide for the use of a tracking algorithm during the new determination of the movement information, (e.g., of the signal component matrix), wherein the tracking algorithm uses the previous movement information and the subsequently recorded pilot tone signal. In other words, the previously determined signal components and the newly arriving pilot tone signals are used to update the movement information automatically and incrementally, if applicable. This procedure is referred to as "Online Non-negative Matrix Factorization" (ONMF) in the cited article by Bin Cao et al.

In an effective development, if a warning criterion is met which evaluates in particular the weighting matrix and/or the results of the re-learning criterion and/or which indicates the presence of an undesired movement for the imaging, provision is further made for a warning to be output to a user and/or for the recording of magnetic resonance data to be interrupted and/or for magnetic resonance data recorded during the undesired movement to be discarded. This means that if, as indicated in particular by weightings other than the weightings assigned to the movement component, unintentional movements of the patient are present, this may likewise be detected and corresponding measures may be adopted so that, e.g., magnetic resonance data is re-recorded again, or an operator is at least made aware of the problem. A report may also be relevant if a change occurs in respect of the pilot tone signal itself, which may be relevant because, e.g., the distance from the high-frequency coil or the distance of the transmit unit from the high-frequency coil may easily have an influence which triggers a new learning process and may also be brought to the attention of the operator. Another event which may trigger measures is, for example, a change from thoracic respiration to abdominal respiration when analyzing the respiratory movement as a movement component.

According to a further embodiment, in the case of a parallel recording of magnetic resonance data by the magnetic resonance facility along a recording trajectory in the k-space, provision is made for the sampling time window for the pilot tone signal to be synchronized with the recording trajectory, in particular such that trajectory sections recorded in individual repetitions may be assigned to a sampling time window, wherein if a re-recording criterion indicating the presence of an undesired movement is met for a trajectory section, the recording for this trajectory section is repeated. The re-recording criterion may also evaluate the weighting matrix and/or the results of the re-learning criterion. In other words, this advantageous embodiment therefore provides for the signal recording trajectory to be synchronized with the sampling time window (therefore the sampling interval) in order to generate a type of online feedback which then triggers a re-recording of magnetic resonance data in the sampling time window if unintentional/undesired movement is detected. In other words, the update rate in respect of the pilot tone signal is selected in such a way that magnetic resonance data within the corresponding sampling time window may be discarded/re-recorded if previously unseen or unsupported movement characteristics are present.

In addition to the method, the present disclosure also relates to a magnetic resonance facility having at least one transmit unit for emitting an excitation signal, a high-frequency coil arrangement for measuring a pilot tone signal that is generated by the excitation signal, and a control facility which is designed to perform the method. All of the explanations relating to the method may be transferred analogously to the magnetic resonance facility, by which the previously cited advantages may therefore likewise be achieved. The control facility in this case has in particular at least one processor and at least one storage means.

Specifically, the control facility may have function units for performing various acts of the method. For example, a learning unit may specifically be provided for the purpose of determining the movement information, wherein use may additionally be made of an extraction unit in order to use the movement information for the purpose of extracting a movement signal describing the movement component from the pilot tone signal. Further function units are obviously also conceivable according to the embodiments as described. In particular, the control facility may have a sequence unit in order that the recording of magnetic resonance data may be controlled accordingly.

A computer program may be loaded directly into a storage a control facility of a magnetic resonance facility, for example, in order to execute the acts of a method when the computer program is executed in the control facility of the magnetic resonance facility. An electronically readable data medium includes electronically readable control information which is stored thereon, and which includes at least one computer program and is so configured as to perform a method when the data medium is used in a control facility of a magnetic resonance facility. The data medium may be a non-transient data medium, e.g. a CD-ROM.

BRIEF DESCRIPTION OF THE DRAWINGS

Further advantages and details of the present disclosure are derived from the exemplary embodiments described in the following and with reference to the drawing, in which.

DETAILED DESCRIPTION

Figure 1:
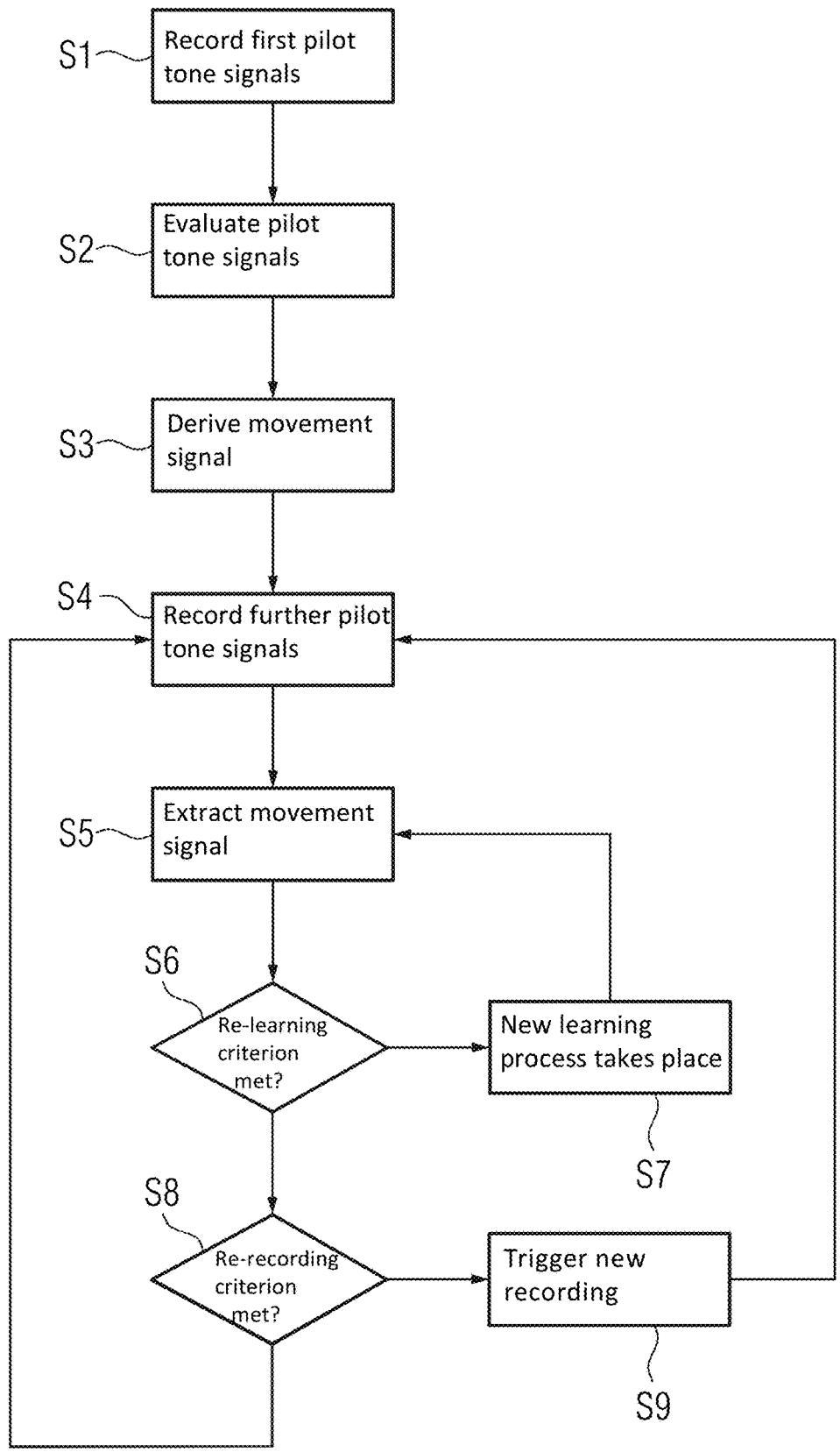
FIG. 1 depicts a flow diagram of an exemplary embodiment of the method.

FIG. 1 depicts a flow diagram of a method, as deployed for evaluating pilot tone signals in a magnetic resonance facility for the purpose of movement monitoring. In the present exemplary embodiment, it is intended to extract a movement signal which is assigned to the respiratory movement as a movement component, and which may then be deployed for further purposes, e.g., for triggering specific recording sections of magnetic resonance data, for retrospective movement correction, and the like. In order that the pilot tone signal may be measured, a transmit unit emits an excitation signal in a first frequency band, which excitation signal is measured again as a pilot tone signal by a high-frequency coil arrangement that is also used here for the measurement of magnetic resonance signals. In this case, a plurality of high-frequency coils of the high-frequency coil arrangement are deployed, defining various receive channels, e.g., 10 to 40 receive channels, wherein the received signals in the individual receive channels, generated by the excitation signal, are referred to collectively as the pilot tone signal.

In act S1, first pilot tone signals are recorded during a calibration time period which may include a plurality of sampling time windows. These are evaluated in act S2 in order to determine movement information, wherein non-negative matrix factorization is used. In a preparatory act as a sub act of the act S2, the pilot tone signal which is recorded in the act S1 for the calibration time period, which may have a length of, e.g., 10 seconds for the respiratory movement, is converted into a time series of magnitude power spectra, one magnitude power spectrum being determined for each sampling time window as a defined time segment in this case. To this end, the signal of a sampling time window is moved into the frequency space by a discrete Fourier transformation and then multiplied by its complex conjugate for each individual signal value in order to obtain a power spectrum. In this way, the pilot tone signal is converted into the various spectral frequency components of the different receive channels.

The subsequent sub act of the act S2 is a learning act. Here, the magnitude power spectra are combined to form a signal matrix V, a long column vector in this case. This signal vector or this signal matrix V is then considered a product of a signal component matrix W, which contains the base vectors (e.g., signal components) as columns, and a weighting matrix H (therefore also a weighting vector in this case). The matrix W and the matrix H are non-negative in this case. A target function is also formulated, which not only requires that the product corresponds as closely as possible to the signal matrix V in this case, but also that W and H are sparsely populated. W and H are determined via an optimization process, the principles of which are known for NMF.

In a third sub act of the act S2, selection criteria are used to identify those signal components in the matrix W which are to be assigned to the respiratory movement, and which therefore describe this. In this case, e.g., frequency properties and magnitudes may be evaluated, e.g., by implementing bandpass filters or calculating ratios of signal energies, wherein noise and/or entropy analyses are likewise conceivable, the principles of which are known. The result of the act S2 is therefore movement information which contains both the complete base of signal components, therefore the complete matrix W, and selection information that describes which signal components are assigned to the movement component, the respiratory movement here.

It is therefore possible in act S3 to derive a movement signal which only or at least clearly describes the respiratory movement from the pilot tone signal. In order to achieve this, it is merely necessary in the act S3 to correspondingly reduce the weighting matrix H that was determined in the act S2, specifically be setting to zero all weightings assigned to signal components that do not relate to the respiratory movement, so that an extracted power spectrum may be determined from which the movement signal may be derived by inverse Fourier transformation. The Fourier transformation may take the form of a fast Fourier transformation (FFT) in this case.

The acts S1 to S3 therefore represent a calibration process which may be performed again for each examination process of a specific patient. This calibration process, in particular the act S2, may otherwise be assisted by a default signal which may be derived from, e.g., a magnetic resonance navigator and/or a respiratory belt.

Monitoring and if applicable correction of the movement information takes place in the following acts. This may be based on the approach described in the previously cited article by Bin Cao et al. A specific embodiment is explained in the following.

In act S4, further received signals of the receive channels, therefore a further pilot tone signal, are recorded during a sampling time window. In this case, the sampling time windows may already be synchronized with a current k-space trajectory for the recording of magnetic resonance data, such that pilot tone signals may be assigned to specific trajectory sections, (e.g., k-space rows), which will be used in the following.

In act S5, the movement signal relating to the respiratory movement is extracted again using the movement information. For this purpose, the magnitude power spectrum, therefore a vector or a signal matrix V, is then formed as described above for the current pilot tone signal. This allows the weighting matrix H to be determined as: $H=W'\times V$, where $W'$ is the pseudo inverse of W. As in the act S3, it is now possible to create a restricted weighting matrix $H°$ from the determined weighting matrix H, specifically by setting to zero all signal components (or their weightings) that are not assigned to the respiratory movement. An extracted power spectrum $V°=W\times H°$ is then produced. The movement signal which describes the respiratory movement is produced by an inverse Fourier transformation of $V°$.

At this point, in the case of a plurality of relevant signal components for a movement component of the total movement, it is also conceivable to use a plurality of movement signals, (e.g., one for each signal component), particularly if they exhibit similar behavior and may therefore be deployed for reciprocal validation and/or to increase the resilience.

In act S6, it is then checked whether a re-learning criterion is met, which here means whether the product of the last determined weighting matrix H and the signal component matrix W according to movement information diverges by more than a first threshold value from the signal matrix S of the current pilot tone signal, or whether at least one of the weightings of the weighting matrix H exceeds a second threshold value. If so, in act S7 a new learning process takes place which does not however require complete re-processing of all pilot tone signals but as described, e.g., by Bin Cao et al., effectively corrects the movement information in the sense of a progressive adjustment. The previous movement information and the current pilot tone signal are used for this purpose. By the movement information updated thus, a corrected movement signal is then also determined in act S5.

In act S8, it is checked whether a re-recording criterion for the current trajectory section is met. On the basis of the previously described synchronization, it is possible by evaluating the results of the re-learning criterion and evaluating the weighting matrix H to assess whether an undesired movement or undesired movement characteristic is present, so that the magnetic resonance data of this trajectory section may then be discarded, and a new recording of the trajectory section may be triggered in act S9. It is also conceivable simply to discard magnetic resonance data of this trajectory section. The method is then continued with the act S4.

A warning criterion may also be used in order to perform other measures, e.g., output a warning to a user that the recording of magnetic resonance data may be interrupted or similar.

The method may then also end when the examination process for the patient is complete.

Figure 2:
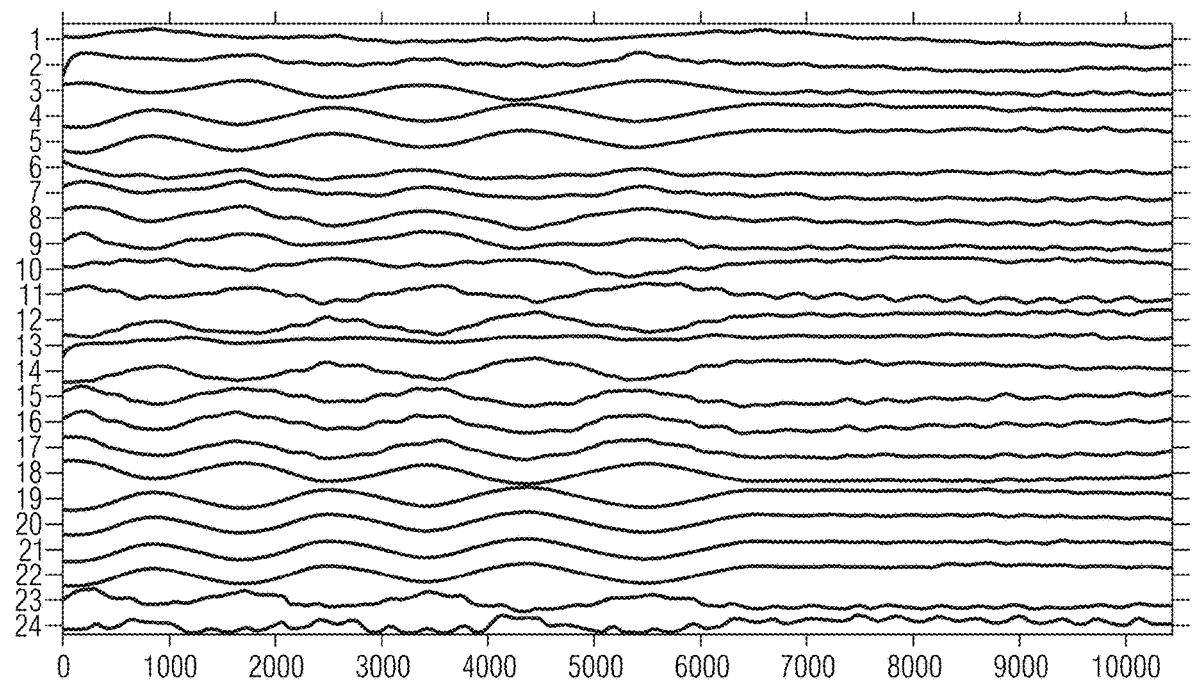
FIG. 2 depicts an example of a recorded pilot tone signal in the time domain.
Figure 3:
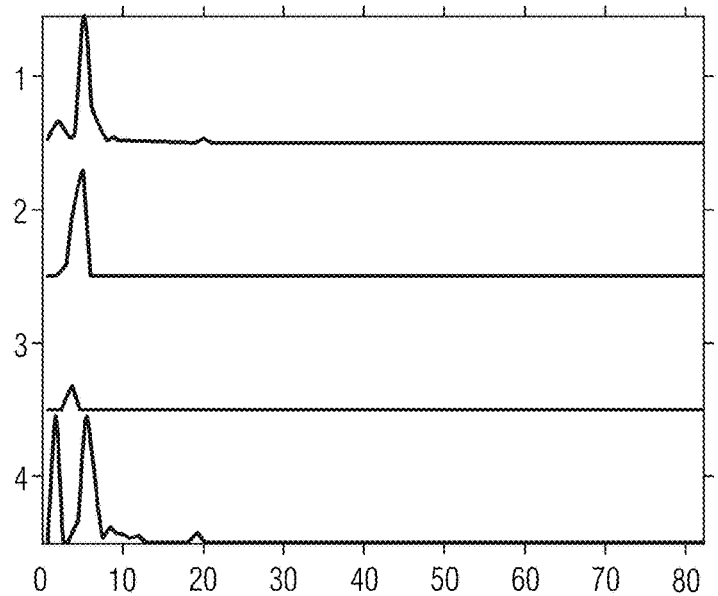
FIG. 3 depicts an example of the breakdown or decomposition of the power spectra of the signal from FIG. 1 in four components.
Figure 4:
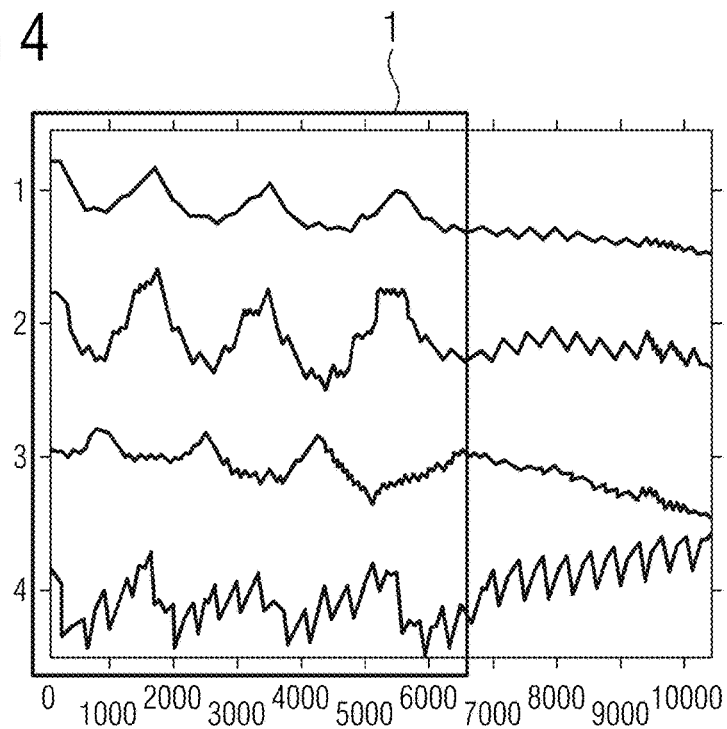
FIG. 4 depicts an example of the portions of selected signal components of the respiratory movement in the time domain.

FIGS. 2 to 4 depict exemplary intermediate results of the method for the purpose of illustration. FIG. 2 depicts pure pilot tone signals as used in the example as per FIGS. 2 to 4. In this case, the pilot tone signals include towards the end, from approximately sample 6500, a respiration suspension phase after a phase of free respiration. The phase of the free respiration is used as a calibration time period in this case. The resulting solution, therefore the movement information, was applied to the complete dataset as illustrated in FIG. 2.

FIG. 3 depicts the representation of the pilot tone signals in FIG. 2 as magnitude power spectra after factorization into four signal components. The signal components are clearly separated on the basis of their frequency content. FIG. 4 depicts movement signals for the four individual components, applied to the complete dataset from FIG. 2. The calibration time period 1 is marked by a box. It may be seen that no signal component shows the pure respiratory signal during the phase of free respiration, because remaining respiration components are also visible in further movement signals, but the separation is sufficient to allow further processing.

Figure 5:
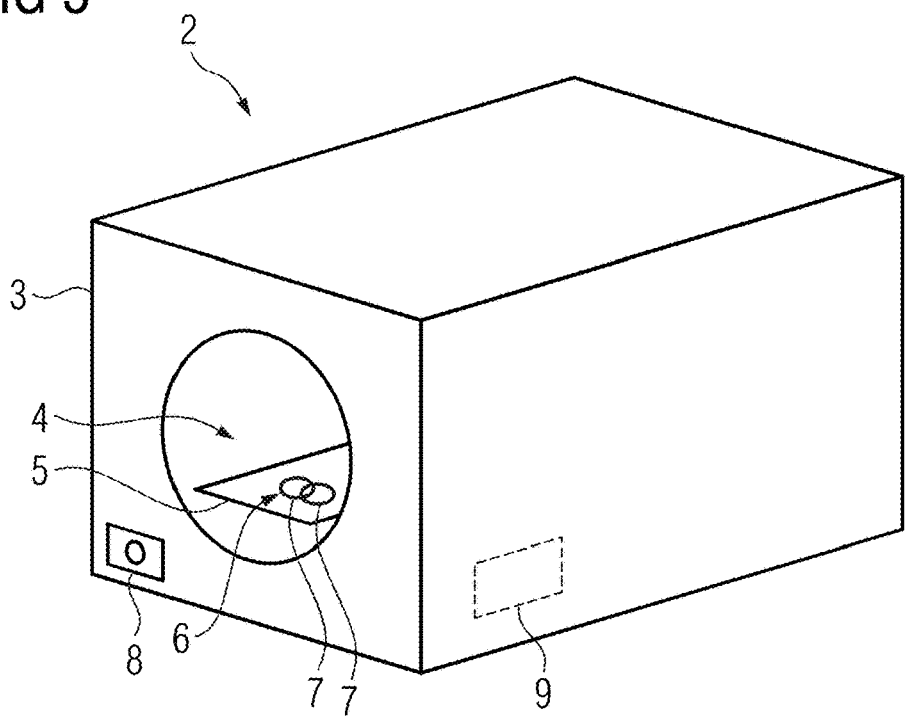
FIG. 5 depicts an example of a magnetic resonance facility.

FIG. 5 depicts a schematic diagram of a magnetic resonance facility 2. This has a main magnet unit 3, the principles of which are known, containing the basic field magnets and defining a patient holder 4 into which a patient may be introduced by a patient couch 5. In addition to a gradient coil arrangement which is not shown in detail here, the magnetic resonance facility 2 includes a high-frequency coil arrangement 6 in this case, illustrated only schematically here by two high-frequency coils 7. The magnetic resonance facility 2 also includes a transmit unit 8 for emitting an excitation signal which may be recorded again by the high-frequency coil arrangement 6 as a pilot tone signal in order to measure a movement of a patient arranged on the patient couch 5. The operation of the magnetic resonance facility 2 is controlled by a control facility 9 which is designed to perform the method.

Figure 6:
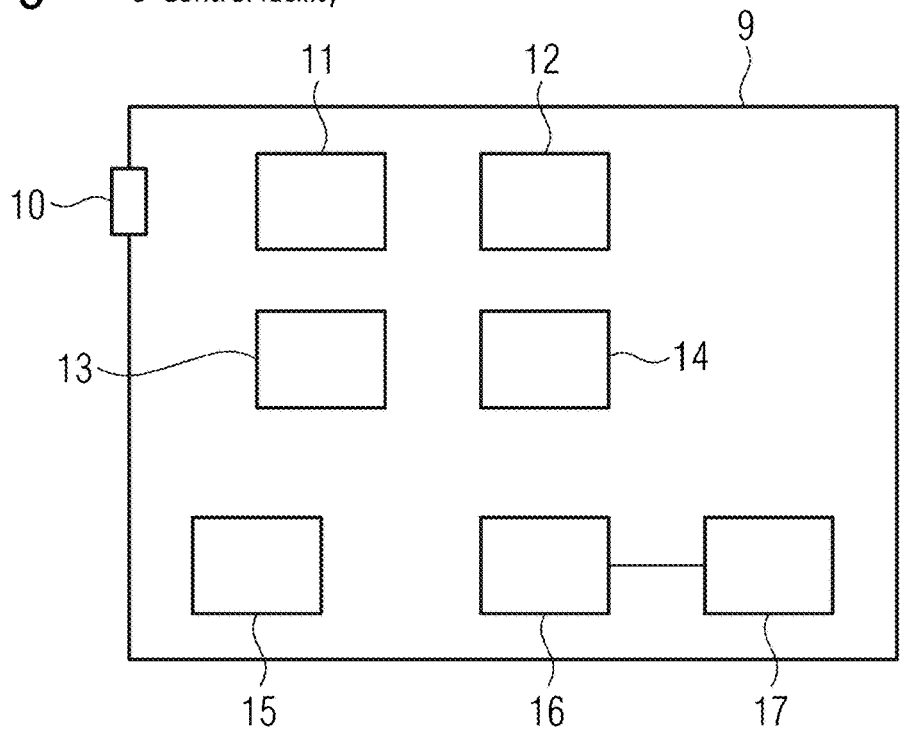
FIG. 6 depicts an example of the functional structure of the control facility of the magnetic resonance facility as per FIG. 5.

FIG. 6 depicts the functional structure of the control facility 9 in greater detail. For the purpose of performing the method, the control facility 9 firstly has an interface 10 for receiving measured pilot tone signals (acts S1 and S4). A learning unit 11 is provided for performing the act S2, therefore determining the movement information. In an extraction unit 12, movement signals may be extracted from the pilot tone signal on the basis of the movement information; see acts S3 and S5.

The control facility 9 also includes two monitoring units 13, 14, wherein the monitoring unit 13 monitors the validity of the movement information and corrects this if applicable; see acts S6 and S7. The monitoring unit 14 checks for undesired movement characteristics, so that a re-recording of a trajectory section of the k-space trajectory may be triggered; see acts S8 and S9. A storage means 15 may be used to hold e.g. the current movement information and other data.

The control facility 9 here also includes a sequence unit 16 for controlling the recording of the magnetic resonance data and an evaluation unit 17 for reconstructing magnetic resonance image datasets or other recording results from magnetic resonance data that has been recorded. Both units 16, 17 may make use of the extracted movement signal describing the respiratory movement, e.g. for the purpose of triggering, selecting magnetic resonance data, retrospective movement correction and the like.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

Although the disclosure is illustrated and described in detail with reference to the exemplary embodiments, the disclosure is not restricted by the examples disclosed, and other variations may be derived therefrom by a person skilled in the art without departing from the scope of the disclosure.

The invention claimed is:

1. A computer-implemented method comprising:
   recording a pilot tone signal using a high-frequency coil arrangement of a magnetic resonance facility, wherein the pilot tone signal describes a movement of a patient being examined; and
   extracting movement information from the pilot tone signal comprising signal components having assigned weightings, wherein the movement information is assigned to a movement component; and
   triggering a new recording of image data for a trajectory section of an imaging, performing a movement correction, and/or selecting magnetic resonance data using the extracted movement information,
   wherein, for the extracting of the movement information, a part of an individual component assigned to the movement component is selected by a selection criterion, and
   wherein, in determining the individual component and the weightings, a non-negative matrix factorization is performed, in context of which a signal matrix, which is formed from the pilot tone signal, is formulated as a product of a non-negative signal component matrix that describes the individual component and a non-negative weighting matrix that describes the weightings.

2. The method of claim 1, wherein the movement of the patient is a respiratory movement of the patient.

3. The method of claim 1, wherein the signal matrix is non-negative.

4. The method of claim 1, wherein the non-negative signal component matrix and the non-negative weighting matrix are determined in an optimization process using a target function, and
   wherein the target function comprises a term which minimizes at least a norm of a difference between the signal matrix and the product of the non-negative signal component matrix and the non-negative weighting matrix.

5. The method of claim 4, wherein a further term of the target function adds a sparsely populated weighting matrix and/or a sparsely populated signal component matrix as an optimization target.

6. The method of claim 1, wherein a magnitude power spectrum in a frequency space is determined as the signal matrix, for which purpose the pilot tone signal is Fourier-transformed and multiplied by its complex conjugate for each matrix entry.

7. The method of claim 6, wherein the signal matrix is formulated as a row vector containing all receive channels.

8. The method of claim 1, wherein, in determining the movement information that describes a periodic movement component, the selection criterion comprises: a bandpass filter which selects a frequency range of the periodic movement component, a determination of a ratio of a signal energy within the frequency range to a signal energy outside the frequency range, a noise analysis, an entropy analysis, or a combination thereof.

9. The method of claim 1, wherein the movement information describing the signal components assigned to the movement component is specified for a calibration time period and is applied to subsequently recorded pilot tone signals for the extracting of the movement component.

10. The method of claim 9, wherein the movement information is applied to subsequently recorded pilot tone signals for determining a weighting matrix of the subsequently recorded pilot tone signal.

11. The method of claim 9, wherein when a re-learning criterion is met which indicates that long-term suitability of a currently used individual component no longer applies, a new determination of the movement information is effected, taking a previous movement information as a starting point.

12. The method of claim 11, wherein the re-learning criterion checks: (1) whether a divergence value which describes a divergence of the product of the signal component matrix that is stored as part of the movement information and the determined weighting matrix of the subsequently recorded pilot tone signal from the signal matrix of the subsequently recorded pilot tone signal exceeds a first threshold value, and/or (2) whether a second threshold value is exceeded for at least one weighting of the determined weighting matrix of the subsequently recorded pilot tone signal.

13. The method of claim 11, wherein, for the new determination of the movement information, a tracking algorithm is applied which uses the previous movement information and the subsequently recorded pilot tone signal.

14. The method of claim 13, wherein the tracking algorithm is applied for the new determination of the signal component matrix of the movement information.

15. The method of claim 1, wherein, when a warning criterion is met which evaluates one or more of the weighting matrix, results of a re-learning criterion, or a presence of an undesired movement for the imaging, then the method further comprises:
   outputting a warning to a user, interrupting the recording of magnetic resonance data, or a combination thereof.

16. The method of claim 1, wherein, in a case of a parallel recording of magnetic resonance data by the magnetic resonance facility along a recording trajectory in k-space, a sampling time window for the pilot tone signal is synchronized with the recording trajectory.

17. The method of claim 16, wherein trajectory sections are recorded in individual repetitions and are assigned to the sampling time window, and
   wherein, when a re-recording criterion indicating a presence of an undesired movement is met for a trajectory section of the trajectory sections, the recording for the trajectory section is repeated.

18. A magnetic resonance facility comprising:
   at least one transmit coil configured to emit an excitation signal;
   a high-frequency coil arrangement configured to measure a pilot tone signal generated by the excitation signal, wherein the pilot tone signal describes a movement of a patient; and
   a control facility configured to:
      extract movement information from the pilot tone signal comprising signal components having assigned weightings, wherein the movement information is assigned to a movement component; and
      trigger a new recording of image data for a trajectory section of an imaging, perform a movement correction, and/or select magnetic resonance data using the extracted movement information,
   wherein, for the extracting of the movement information, a part of an individual component assigned to the movement component is selected by a selection criterion, and
   wherein, in determining the individual component and the weightings, a non-negative matrix factorization is performed, in context of which a signal matrix, which is formed from the pilot tone signal, is formulated as a product of a non-negative signal component matrix that describes the individual component and a non-negative weighting matrix that describes the weightings.

19. A computer program, which, when executed on a control facility of a magnetic resonance facility, causes the magnetic resonance facility to:
   record a pilot tone signal using a high-frequency coil arrangement of the magnetic resonance facility, wherein the pilot tone signal describes a movement of a patient; and
   extract movement information from the pilot tone signal comprising signal components having assigned weightings, wherein the movement information is assigned to a movement component; and
   trigger a new recording of image data for a trajectory section of an imaging, perform a movement correction, and/or select magnetic resonance data using the extracted movement information,
   wherein, for the extracting of the movement information, a part of an individual component assigned to the movement component is selected by a selection criterion, and
   wherein, in determining the individual component and the weightings, a non-negative matrix factorization is performed, in context of which a signal matrix, which is formed from the pilot tone signal, is formulated as a product of a non-negative signal component matrix that describes the individual component and a non-negative weighting matrix that describes the weightings.

20. The method of claim 1, further comprising, prior to the triggering of the new recording:
   identifying an undesired movement or an undesired movement characteristic of the patient being examined by the magnetic resonance facility via an evaluation of the extracted movement information; and
   discarding image data for the trajectory section of the imaging associated with the undesired movement or the undesired movement characteristic.

* * * * *